US011226698B2

(12) United States Patent
Sethuraman et al.

(10) Patent No.: US 11,226,698 B2
(45) Date of Patent: Jan. 18, 2022

(54) INCONSPICUOUS SENSING SYSTEM ACROSS MULTIPLE SURFACES

(71) Applicant: MOTOROLA MOBILITY LLC, Chicago, IL (US)

(72) Inventors: Suresh Sethuraman, Vernon Hills, IL (US); Kiyoun Cho, Arlington Heights, IL (US); Jonathon J. Prinz, San Francisco, CA (US); Kathryn E. Thomas, Chicago, IL (US); Francis Kuzhiyil, Deerfield, IL (US); Alexis G. Valasek, Chicago, IL (US)

(73) Assignee: Motorola Mobility LLC, Chicago, IL (US)

( * ) Notice: Subject to any disclaimer, the term of this patent is extended or adjusted under 35 U.S.C. 154(b) by 37 days.

(21) Appl. No.: 16/137,045

(22) Filed: Sep. 20, 2018

(65) Prior Publication Data

US 2020/0097117 A1    Mar. 26, 2020

(51) Int. Cl.
*G06F 3/041*  (2006.01)
*G01L 5/22*   (2006.01)

(52) U.S. Cl.
CPC ............ *G06F 3/0414* (2013.01); *G01L 5/228* (2013.01); *G06F 3/0418* (2013.01)

(58) Field of Classification Search
CPC ....... G06F 3/0414; G06F 3/0418; G01L 5/228
USPC ........................................................ 345/178
See application file for complete search history.

(56) References Cited

U.S. PATENT DOCUMENTS

| 2011/0037721 | A1* | 2/2011 | Cranfill ................... G06F 3/044 345/174 |
| 2014/0282051 | A1* | 9/2014 | Cruz-Hernandez ..... G06F 1/169 715/744 |
| 2014/0317722 | A1* | 10/2014 | Tartz ....................... G06F 21/32 726/19 |
| 2018/0074636 | A1* | 3/2018 | Lee ........................ G06F 3/0481 |

OTHER PUBLICATIONS

"Scroll Buttons for Mobile Device" Texas Instruments, 2007.
Samiappan, Jaya, "Making smartphones smarter with capacitive touch sensing", Jan. 12, 2016.

* cited by examiner

*Primary Examiner* — Amare Mengistu
*Assistant Examiner* — Gloryvid Figueroa-Gibson
(74) *Attorney, Agent, or Firm* — Isidore PLLC

(57) ABSTRACT

A method for detecting, by a force sensing circuit within an electronic device, a change in force applied to a surface of the electronic device. The method includes correlating the change in the force applied to the surface to a functional change of at least one setting of the electronic device. The method further includes identifying when a detected change is a first change of the change in force, which corresponds to a trigger that activates at least one of a plurality of sensing devices within the force sensing circuit to monitor for a subsequent change in the force. In response to detecting the subsequent change of the change in force, the method includes adjusting the at least one setting of the electronic device based on the subsequent change of the force.

20 Claims, 10 Drawing Sheets

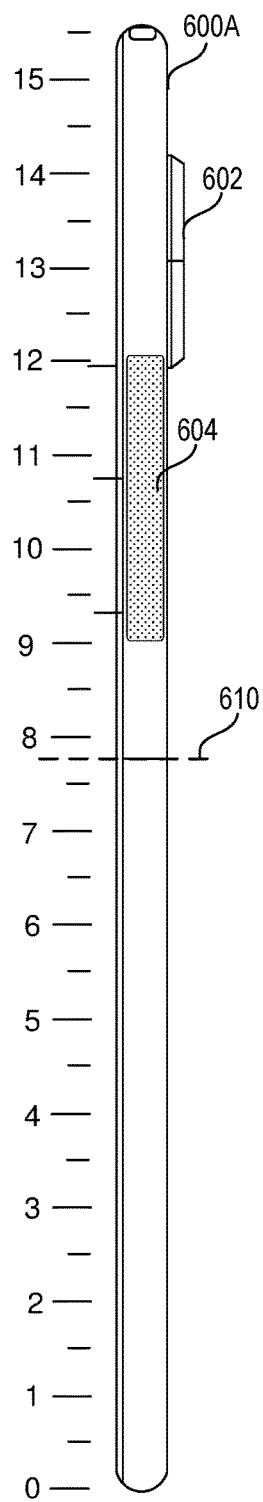 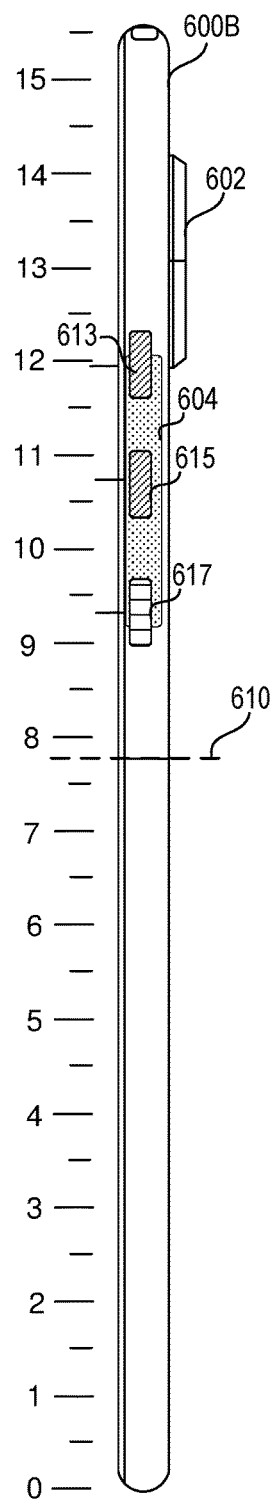 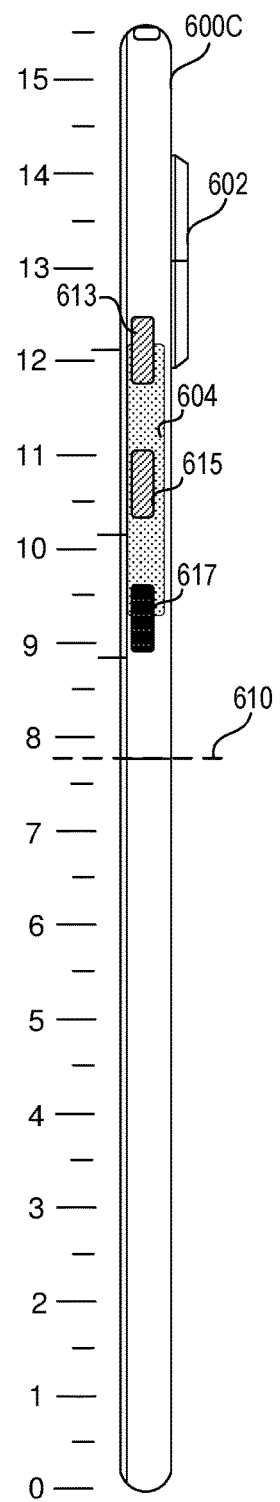 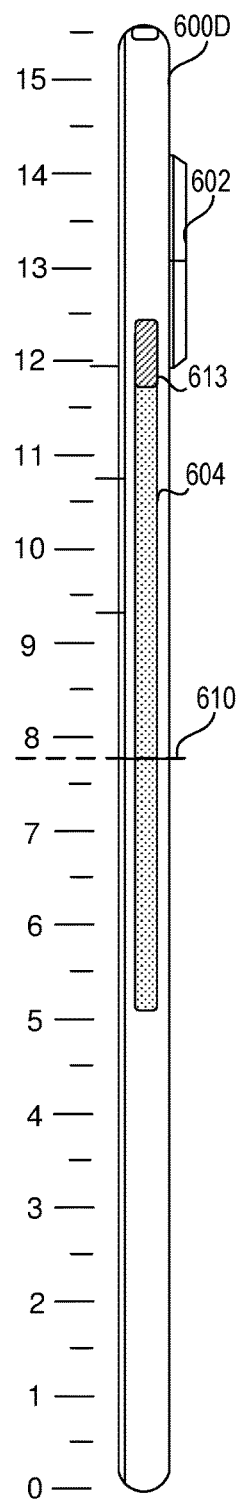
*FIG. 6A*  *FIG. 6B*  *FIG. 6C*  *FIG. 6D*

INCONSPICUOUS SENSING SYSTEM ACROSS MULTIPLE SURFACES

BACKGROUND

1. Technical Field

The present disclosure generally relates to electronic devices and in particular to a method for integrating sensing technology with electronic devices.

2. Description of the Related Art

The technology involved in the design of mobile communication devices is continuously improving. Modern modifications in electrical components have enabled mobile devices to incorporate larger screen sizes and reduced borders. The continuously increasing screen sizes have impacted the ability to design in typical features, such as physical side keys, while maintaining a comfortable ergonomically correct grip. The physical side keys handle basic user interactions, which can include, for example, power up and power down of the device, changing volume settings, and/or switching applications, to name a few functions. In addition to an increase in screen size, mobile devices are becoming increasingly thinner, thereby depleting the area for physical keys and buttons.

BRIEF DESCRIPTION OF THE DRAWINGS

The description of the illustrative embodiments is to be read in conjunction with the accompanying drawings. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which:

FIG. 6A illustrates an example force detection area for an embedded sensor array at a surface of a mobile device, in accordance with one or more embodiments;

FIG. 6B illustrates a second example force detection area for an embedded sensor array at a surface of a mobile device, in accordance with one or more embodiments;

FIG. 6C illustrates a third example force detection area for an embedded sensor array at a surface of a mobile device, in accordance with one or more embodiments;

FIG. 6D illustrates a fourth example force detection area for an embedded sensor array at a surface of a mobile device, in accordance with one or more embodiments;

DETAILED DESCRIPTION

Figure 1:
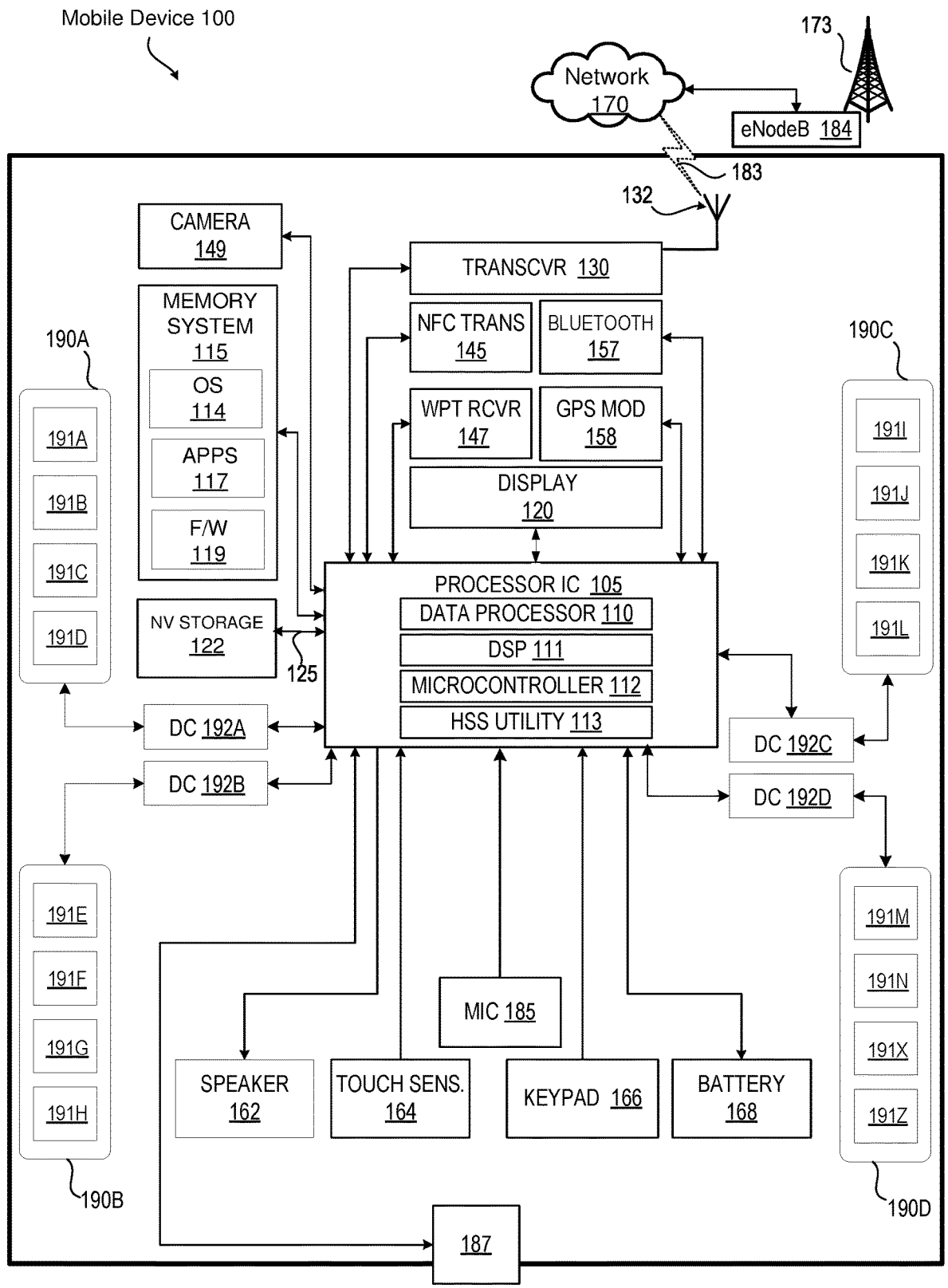
FIG. 1 illustrates a mobile device within which certain aspects of the disclosure can be practiced, in accordance with one or more embodiments.
Figure 2:
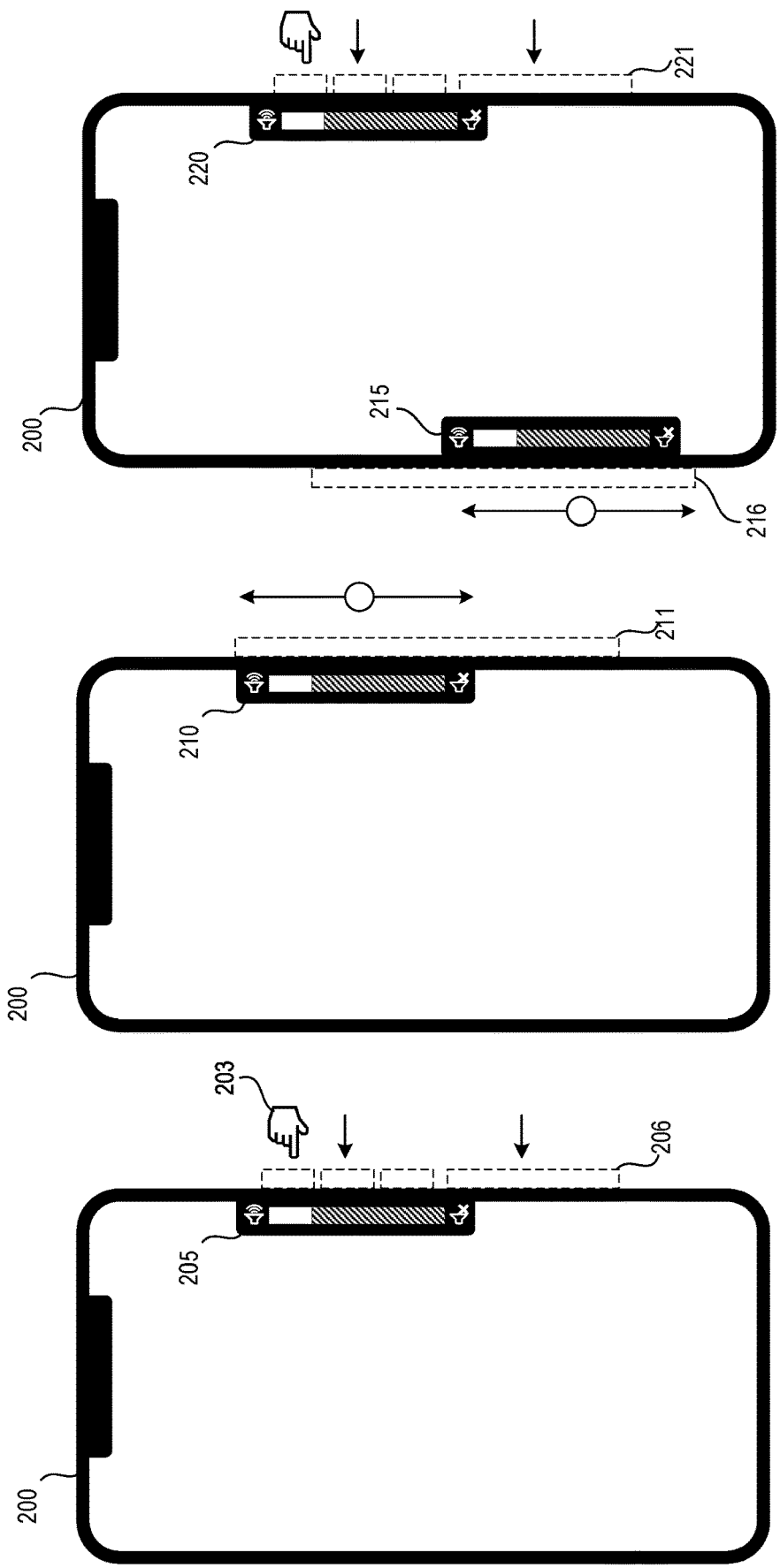
FIG. 2A illustrates an example implementation of a single-side, force-sensitive, embedded sensor array configured to be utilized within a mobile device, in accordance with one or more embodiments.
FIG. 2B illustrates an example implementation of a single-side, linear force-sensitive, embedded sensor array configured to be utilized within a mobile device, in accordance with one or more embodiments.
FIG. 2C illustrates an example implementation of a dual-side, force-sensitive, embedded sensor array configured to be utilized within a mobile device, in accordance with one or more embodiments.

Disclosed are a method and a mobile device that provides force-sensitive detection at the surface of a mobile device to change one or more settings associated with the utilization of the mobile device. The method includes detecting, by a force sensing circuit within an electronic device, a change in force applied to a surface of the electronic device. The method includes correlating the change in the force applied to the surface to a functional change of at least one setting of the electronic device. The method further includes identifying when a detected change in force is a first change, which corresponds to a trigger that activates at least one of a plurality of sensing devices within the force sensing circuit to monitor for a subsequent change in the force. In response to detecting the subsequent change in force, the method includes adjusting the at least one setting of the electronic device based on the subsequent change of the force.

In the following description, specific example embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various aspects are described which may be aspects for some embodiments but not other embodiments.

The terminology used herein is for the purpose of describing particular embodiments only and is not intended to be limiting of the disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Moreover, the use of the terms first, second, etc. do not denote any order or importance, but rather the terms first, second, etc. are used to distinguish one element from another.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be provided its broadest interpretation given the context in which that term is utilized.

Within the descriptions of the different views of the figures, the use of the same reference numerals and/or symbols in different drawings indicates similar or identical items, and similar elements can be provided similar names and reference numerals throughout the figure(s). The specific identifiers/names and reference numerals assigned to the elements are provided solely to aid in the description and are not meant to imply any limitations (structural or functional or otherwise) on the described embodiments.

With reference now to the figures, and beginning with FIG. 1, there is depicted an example mobile device 100, within which one or more of the described features of the various embodiments of the disclosure can be implemented. In one embodiment, device 100 can be any electronic device that is equipped with functional settings. For example, device 100 can include, but is not limited to, virtual reality headsets, entertainment devices, gaming peripherals, a desktop computer, a monitor, a notebook computer, a mobile/cellular phone, a mobile/cellular phone accessory, a digital camera, a video recorder, or a tablet computer.

Mobile device 100 includes at least one processor or processor integrated circuit 105. Included within processor IC 105 are data processor 110, digital signal processor 111, and microcontroller 112. In some embodiments, processor IC 105 can include data processor 110 and digital signal processor (DSP) 111 integrated into a single processing device. Microcontroller 112 collects and polls data from sensor arrays 310A-D. Microcontroller 306 can be for example, a 16-bit or 32-bit low-power high-performance microcontroller. In one embodiment, microcontroller 306 executes one or more algorithm associated with hidden surface sensing utility (HSSU) 113 to enable processor IC 105 to remain in low power status when possible. Processor IC 105 is coupled to memory system 115 and non-volatile (NV) storage 122 via a system communication mechanism, such as system interconnect 125. System interconnect 125 can be interchangeably referred to as a system bus, in one or more embodiments. System interconnect 125 is utilized to connect at least one other component to processor IC 105. For example, system interconnect 125 connects one or more digital converters (DCs) 192A-D to processor IC 105. One or more software and/or firmware modules can be loaded into memory system 115 during operation of mobile device 100. Specifically, in one embodiment, memory system 115 can include therein a plurality of such modules, including firmware (F/W) 119. Memory system 115 may also include basic input/output system and an operating system (not shown). The software and/or firmware modules provide varying functionality when their corresponding program code is executed by data processor 110 or by secondary processing devices within mobile device 100.

As shown, memory system 115 also includes HSSU 113. HSSU 113 may be provided as an application that is optionally located within memory system 110 and executed by processor 105. Within this embodiment, processor 105 executes HSSU 113 to provide the various methods and functions described herein. For simplicity, HSSU 113 is illustrated and described as a stand-alone or separate software/firmware/logic component, which provides the specific functions and methods described herein. However, in at least one embodiment, HSSU 113 may be a component of, may be combined with, or may be incorporated within operating system (OS) 114, and/or with one or more applications 117. Additional aspects of HSSU 113, and functionality thereof, are presented within the description of FIGS. 2-11.

System interconnect 125 supports connection to and processing of signals by processor IC 105 from one or more connected input devices such as display 120, speaker 162, touch sensor 164, microphone 185, and keypad 166. Additionally, in one or more embodiments, one or more of these or other devices can connect via device interface 187. For example, an optical reader, a universal serial bus (USB), a card reader, Personal Computer Memory Card International Association (PCMIA) slot, and/or a high-definition multimedia interface (HDMI), can be associated with and/or connect to mobile device 100 at device interface 187. Mobile device 100 also contains a power source such as a battery 168 that supplies power to mobile device 100.

Mobile device 100 further includes near field communication transceiver (NFC TRANS) 145, wireless power transfer receiver (WPT RCVR) 147, Bluetooth transceiver 157, and global positioning system module (GPS MOD) 158, all of which are in communication with processor IC 105. NFC TRANS 145, WPT RCVR 147, Bluetooth transceiver 124, and GPS MOD 158 enable mobile device 100 and/or components within mobile device 100 to communicate and/or interface with other devices, services, and components that are located external to mobile device 100.

Mobile device 100 also includes transceiver 130 that is communicatively coupled to processor IC 105 and to antenna 132. Transceiver 130 allows for wide-area or local wireless communication between mobile device 100 and evolved node B (eNodeB) 184 via wireless signal 183 in communication with antenna 132. Mobile device 100 is capable of wide-area or local wireless communication with other mobile wireless devices or with eNodeB 184 as a part of a wireless communication network. As a wireless device, mobile device 100 can transmit different types of data over wireless network 170. For example, GPS module 158 communicatively couples to antenna 132 to send/and receive location data.

Mobile device 100 is configured to include force-sensitive embedded sensor array 190A-D, which each include a plurality of sensors. More specifically, sensor array 190A includes sensors 191A-D, sensor array 190B includes sensors 191E-H, sensor array 190C includes sensors 191I-L, and sensor array 190D includes sensors 191M-Z. Each of force-sensitive embedded sensor array 190A-D is respectively connected to DCs 192A-D. DCs 192A-D are, in one example, multiple channel low-noise inductance to digital converters, with integrated algorithms to implement inductive touch applications. By using sensor arrays 190A-D, DCs 192A-D detect deflections initiated at the surface of mobile device 100. As shown in FIG. 1, sensor arrays 190A-D are each positioned along a side of mobile device 100. In one embodiment, sensor arrays 190A-D are coils that utilize inductive sensing technology for human machine interfacing, as will be discussed further, in FIGS. 2-11. Other implementations of sensor arrays are also supported by the disclosure.

Those of ordinary skill in the art will appreciate that the hardware components and basic configuration depicted in the following figures may vary. For example, the illustrative components within mobile device 100 are not intended to be exhaustive, but rather are representative to highlight components that can be utilized to implement the present disclosure. For example, other devices/components may be used in addition to, or in place of, the hardware depicted. The depicted example is not meant to imply architectural or other limitations with respect to the presently described embodiments and/or the general disclosure.

Now turning to FIG. 2A-2C, which illustrate example implementations of force-sensitive embedded sensor arrays, configured to be utilized within a mobile device, in accordance with one or more embodiments. Specifically, FIG. 2A and 2B illustrate a single-sided implementation of a force-sensitive embedded sensor array. FIG. 2A illustrates mobile device 200, tactile motion 203, device setting graphical user interface (GUI) 205, and exterior sensing area 206. Mobile device 200 is configured similarly to mobile device 100. In one embodiment, sensor arrays 190C-D of (FIG. 1) are positioned along a side of mobile device 200, providing sensors that are sensitive to forces received along the respective exterior (side) of a casing of mobile device 200. Sensor arrays 190C-D are spaced to receive instantaneous forces as well as detect a lateral movement of a force at the exterior surface of the casing of mobile device 200. The spacing of the sensors (191I-Z) include discernable gaps in the sensing of exterior sensing area 206. The discernable gaps can enable a binary type sensor to be implemented for on/off functions of a mobile device setting.

Similarly, FIG. 2B illustrates mobile device 200, device setting GUI 210, and exterior sensing area 211. In the embodiment of FIG. 2B, sensor arrays 190C-D of (FIG. 1) are also positioned along a side of mobile device 200 providing sensors that are sensitive to forces received along the respective exterior of mobile device 200. Sensor arrays 190C-D of FIG. 2B are spaced closer together to provide exterior sensing area 211. Exterior sensing area 211 depicts no discernable gaps in the sensing segment. Exterior sensing area 211 receives instantaneous force as well as detects a lateral movement of a force at the exterior surface of the casing of mobile device 200. Further, as a user provides a force above a predetermined threshold along the side exterior casing of mobile device 200, processor IC 105 triggers a linear functional change to a corresponding setting of mobile device 200. Exterior sensing area 211 functions as a single input control that makes linear changes, and in one embodiment is also activated as a binary input device when a force above a predetermined threshold is detected by sensor arrays 190C-D.

FIG. 2C illustrates an example implementation of a dual-side, force-sensitive, embedded sensor array configured to be utilized within a mobile device housing, in accordance with one or more embodiments. FIG. 2C illustrates mobile device 200, device setting GUI 210, and exterior sensing area 221. In the embodiment of FIG. 2C, sensor arrays are utilized on a first and second side of mobile device 200. For example, sensor arrays 190A-D are utilized on a first side and sensor arrays 190C-D are utilized on a second side. In one embodiment, FIG. 2C utilizes the sensor array technology of FIG. 2A on the first and second side. In another embodiment, FIG. 2C utilizes the sensor array technology of FIG. 2B on the first and second side. The illustrated embodiment, depicted by FIG. 2C utilizes a combination of FIG. 2A and FIG. 2B. That is, FIG. 2C illustrates mobile device 200 having both first exterior sensing area 216 and second exterior sensing area 221.

Figure 3:
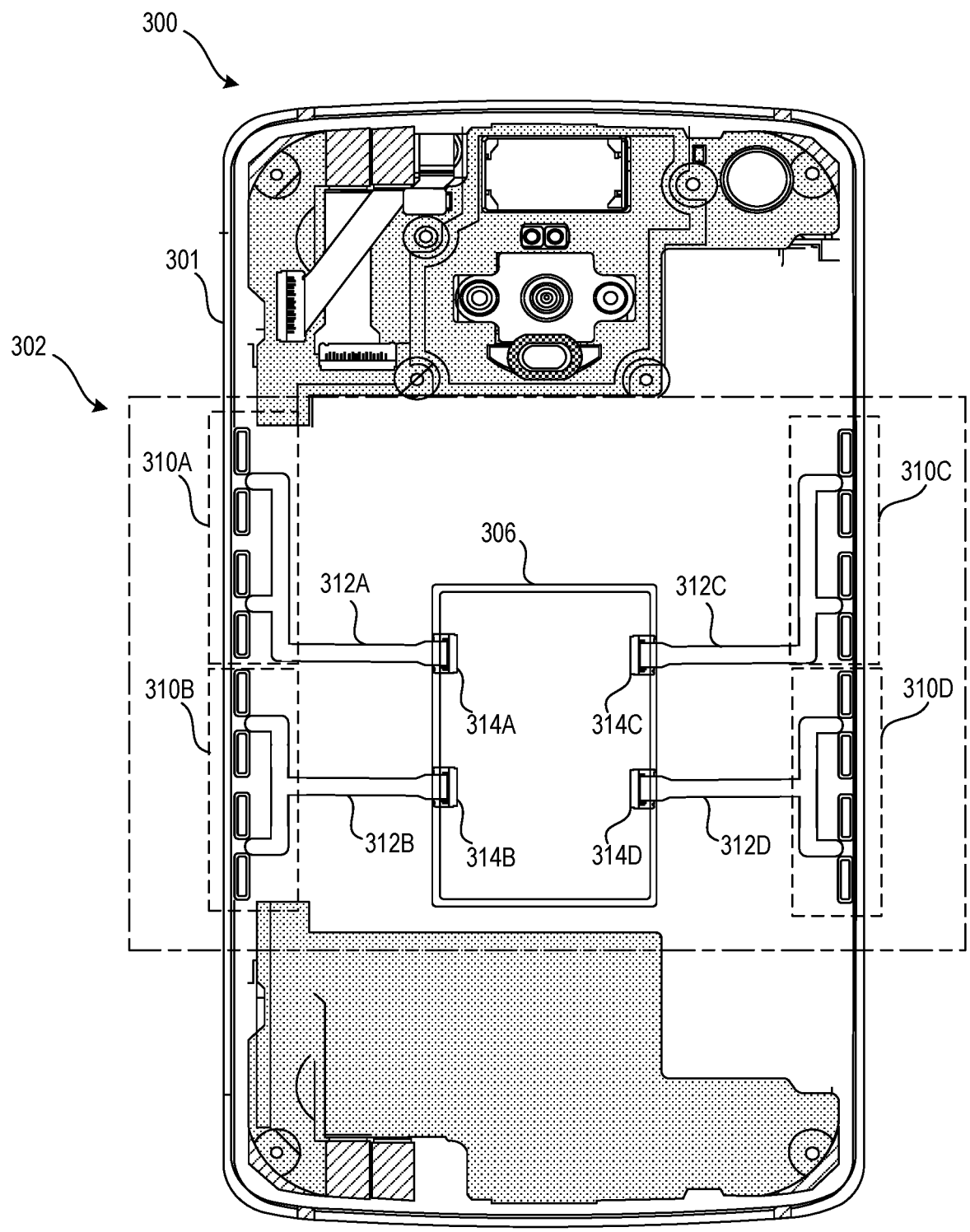
FIG. 3 illustrates example components of a device used for force-sensitive sensing, according to one or more embodiments.

With reference now to FIG. 3, there is illustrated example components of a device used for force-sensitive sensing, according to one or more embodiments. FIG. 3 includes electronic device 300, which includes device casing 301 and force sensing circuit 302. Force sensing circuit 302 includes microcontroller 306, digital converters (DCs) 314A-D, integrated circuit buses 312A-D, and sensor arrays 310A-D. The plurality of sensing devices (sensor arrays 310A-D) is affixed to an interior portion of device casing 301 of electronic device 300.

In operation, electronic device 300 is similar in functionality to mobile device 100. Microcontroller 306 is similar in functionality to microcontroller 112 of FIG. 1. Integrated circuit buses 312A-D can be inter-integrated circuit (I2C) buses. Sensor arrays 310A-D within force sensing circuit 302 detect changes in the change in force at the surface of electronic device 300. The change in force at the exterior surface of device casing 301 can be due to one or more of an input force, pressure, and/or strain detected by sensors (191A-Z). Sensing circuit 302 can be implemented to detect changes in inductance, capacitance, piezo resistance. Processor IC 105 enables sensor arrays 310A-D to convert a received one or more of the input force, the pressure, and/or the strain to an electrical signal to respectively identify which of the plurality of tactile sensors detects the directional movement of the tactile motion.

Each of integrated circuit buses 312A-D respectively read data to/from DCs 314A-D. DCs 314A-D provide force sensing technology, for example inductive sensing. In one embodiment, DCs 314A-D are multi-channel low-noise inductance to digital converters with integrated algorithms to implement inductive touch applications. Microcontroller 306 waits for interrupts from DCs 314A-D and sends recognized tactile motion signals to processor IC 105. DCs 314A-D transmits a respective delta value associated with changes in the force to processor IC 105. Processor IC 105 determines when the recognized tactile motion (203) causes a respective delta value associated with changes in the force at the surface of the electronic device that correlates to activating the first change and the subsequent change in the force at the surface of the electronic device 300. In this embodiment, the first change and the subsequent change are activated when the respective delta in the force is greater than a respective, predetermined force delta threshold. Processor IC 105 further enables microcontroller 306 to identify when a detected change at sensor arrays 310A-D is a first change in force above the delta threshold. The first change in force above a predetermined delta threshold corresponds to a trigger that activates at least one of a plurality of sensing devices within the force sensing circuit to continue monitoring for a subsequent change in the force. In one embodiment, when a first sensor array from among sensor arrays 310A-D receives a force that is above a predetermined threshold, sensor arrays 310A-D registers the change in inductance as a corresponding interrupt signal.

The interrupt signal is respectively provided to microcontroller 306 via a respective integrated circuit bus (312A-D). In response to receiving the interrupt signal, microcontroller 306 polls data registers from DCs 314A-D for subsequent electrical signals that correspond to a force, above a predetermined force threshold, that is received at sensor arrays 310A-D. In response to receiving an electrical signal that corresponds to a force above the predetermined threshold, microcontroller 306 provides the signal information to processor IC 105. Further, microcontroller determines the location of the applied pressure and continues monitoring sensor arrays 310A-D for subsequent signals. Microcontroller 306 continues to provide the signal information to processor IC 105, and processor IC 105 executes HSSU 113 to initiate the device setting change. In response to receiving notification of the subsequent change from the sensing circuit, processor IC 105 adjusts the at least one setting of the electronic device 300, based on the subsequent change in the force. Executing HSSU 113 further enables processor IC 105 to correlate the change in the force applied to the surface to a functional change of at least one setting of electronic device 300. The functional change corresponds to the received signal information (e.g. signal position, movement, and intensity). The functional change can include, but is not limited to including changes to: device power, volume, lighting changes (backlight, screen light, flash light, etc.), switching between screens, switching between applications, scrolling functions, camera functions, camera lens manipulation, display zoom, screen selection/changes, etc.

Figure 4:
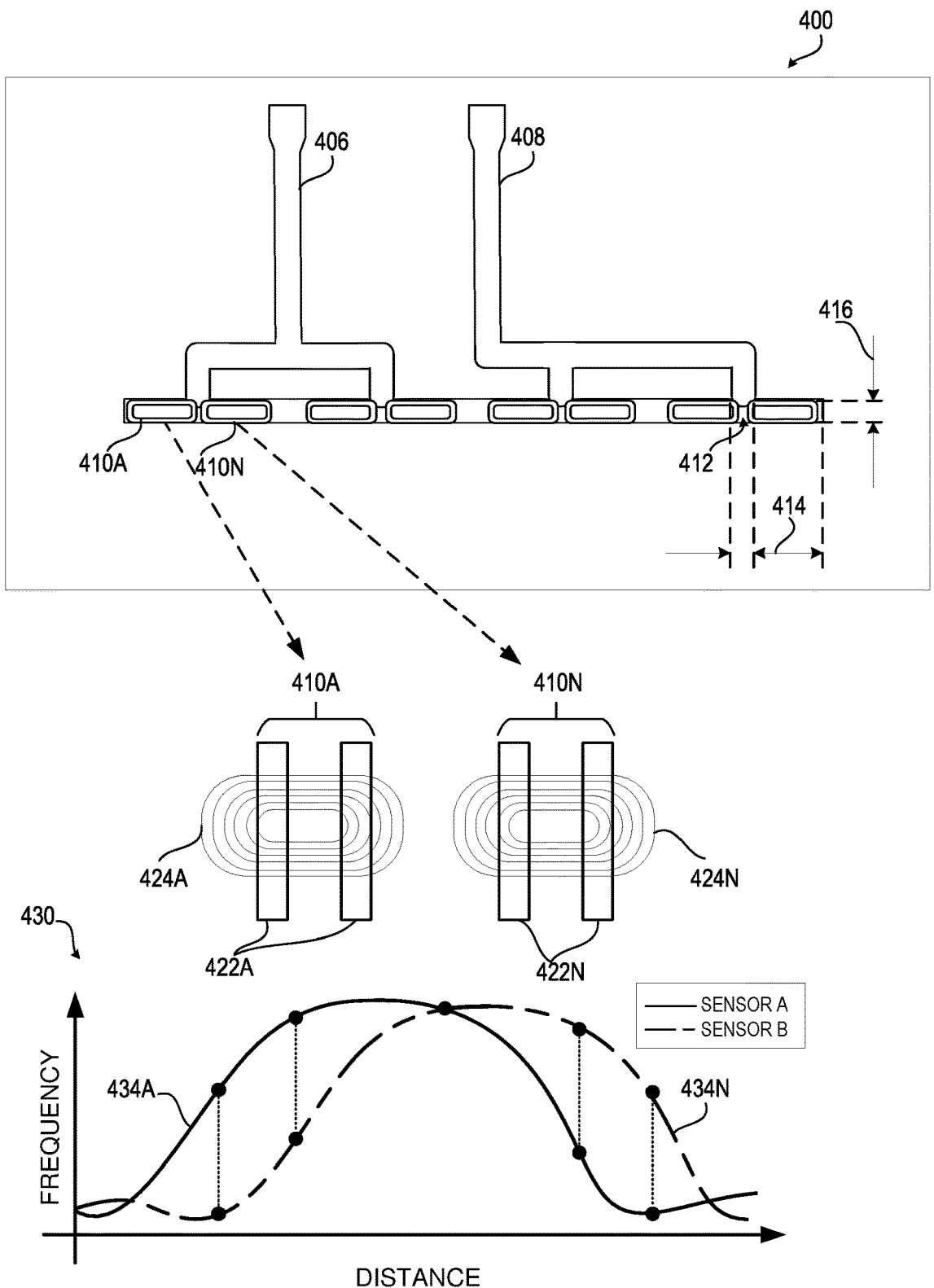
FIG. 4 illustrates example components of a force-sensitive sensor array suitable for use to detect force at the surface of the mobile device of FIG. 1, according to one or more embodiments.

FIG. 4 illustrates example components of a force-sensitive sensor array suitable for use to detect force at the surface of mobile device 100 of FIG. 1, according to one or more embodiments. FIG. 4 presents sensing array 400, sensors 420, and sensor characterization diagram 430. Integrated circuity buses 406 and 408, sensors 410A-N, sensor space 412, sensor length 414, and sensor height 416 form sensing array 400. Each of sensors 410A and 410N respectively include calibration vectors 422A and 422N. Sensor characterization diagram 430 includes sensor A characterization plot 434A and sensor B characterization plot 434N.

In one embodiment, sensors 410A-N include sensor coils 424A-N. Sensors 410A-N each have a predetermined sensor length 414 and sensor height 416. Sensors 410A-N are spaced apart from each other based on a predetermined sensor space 412. Each group of sensor arrays, for example sensor arrays 310A-D, includes sensors having identical sensor length 414, sensor height 416, and sensor space 412. In one embodiment, the sensor arrays vary in sensor length 414, sensor height 416, and sensor space 412 from each other. The variations are compensated for and/or calibrated by HSSU 113 so that the corresponding force position signal is not compromised. In response to sensor coils detecting a force input, processor IC 105 determines the scroll direction and speed of the force interaction from a plurality of sensor coils provided within sensor arrays 310-A-D. In one embodiment, processor IC 105 polls sensor coils 424A-N multiple times in response to an interrupt to identify subsequent force inputs. In response to no force input signal being above a predetermined delta force threshold, no detection is made.

Processor IC 105 utilizes calibration vectors 422A and 422N to calibrate sensor coils 424A-N. Calibration vectors 422A and 422N identify known areas/force input points that are associated with sensor coils 424A-N. In one example sensor coil 424A is engaged (pressed) at calibration vector 422A using a recognized tactile motion (203). The recognized tactile motion (203) has a fixed/known amount of pressure. In response to the recognized tactile motion (203) being an instantaneous input force, processor IC 105 records a value of the instantaneous input force. Recording the value of the instantaneous input force enables processor IC 105 to determine whether the value of the instantaneous input force is above a predetermined threshold. Processor IC 105 determines when the recognized tactile motion (203) causes a respective delta in the force at the surface that correlates to activating the first change and the subsequent change in the force at the surface of electronic device 300. The data for sensor coil 424A is stored to be used as a calibration vector and interpolation points, as illustrated by sensor characterization diagram 430. In response to detecting an initial position and a directional movement of a tactile motion in association with the plurality of sensor coils 424A-N, processor IC 105 determines whether the directional movement of the tactile motion is either an instantaneous input force or a lateral movement force. Processor IC 105 makes the determination based on a magnitude and a time derivative of the change in the force detected at the respective sensors.

Accordingly, processor IC 105 provides changes to one or more device settings from among a plurality of device settings that correspond to the input of the force at the surface of electronic device 300. The device settings can include, but are not limited to including, binary or on/off functions, volume, lighting changes (backlight, screen light, flash light, etc.), switching between screens, switching between applications, scrolling functions, camera functions, camera lens manipulation, display zoom, etc. For example, in response to the value of the instantaneous input force being above the predetermined threshold, processor 105 provides a binary change that enables a toggle between power states (i.e., on/off) of the at least one setting. In another embodiment, processor IC 105 receives input that corresponds to a lateral tactile movement that transitions along a segment of the exterior surface of the device casing 301. In response to the recognized tactile motion (203) detected by sensor coils 424A-N, processor IC 105 provides a linear functional change to a corresponding at least one setting of the electronic device 300. In another embodiment, processor IC 105 maps each of a plurality of recognized tactile motions (203) to a corresponding functional change. The change is respectively associated with at least one of a plurality of settings of electronic device 300.

In still another embodiment, processor IC 105 determines when a recognized tactile motion (203) at sensors 410A-N is one of an instantaneous force and a lateral movement at an exterior surface of device casing 301 of the electronic device 300. Processor IC 105 utilizes calibration vectors 422A-N to calibrate the plurality of sensing devices such as sensor coils 424A-N to selectively respond to detection of the recognized tactile motions. Processor IC 105 detects the initial force at sensor coil 424A that causes the electrical signal to cross the predetermined delta force threshold. DC 314A (FIG. 3) asserts a signal to a first pin of microcontroller 306. Asserting the pin at microcontroller 306 enables processor IC 105 to activate logic for either a button press or slider scroll. As the user continues to swipe over sensors 410A to 410N, subsequent pins are asserted, indicating the swipe event as well as the direction of the swipe event. The subsequent pins are tracked and/or monitored to both confirm the direction of the swipe as well as indicate the speed of the swipe and when the swipe has stopped.

In one or more embodiments, a swipe is detected when the time derivatives of signals from two adjacent sensors carry opposite signs. The signs of the derivatives are used to identify the swipe direction. For example, in response to sensor 410A having a negative time derivative and sensor 410N having a positive time derivative, a left to right scroll is identified, and vice versa. The multi-coil inductive, capacitive, or resistive sensors provided by sensing array 400 allow for the continuous detection of the location of force by measuring the respective change in sensor impedance, capacitance, or resistance. Using the magnitude of the measurement and the time derivative of the respective sensor, the position and the movement of the location of the force can be detected by processor IC 105 to identify button press or scroll. The length of the swipe correlates to the extent of change that occurs with the functional setting. For example, the more a user swipes in a first direction, the more the volume increases. The more the user swipes in a second direction, the more the volume decreases. The amount of swipe associated with the functional change can be customized by the user or default settings can be selected to control the amount of change.

Figure 5:
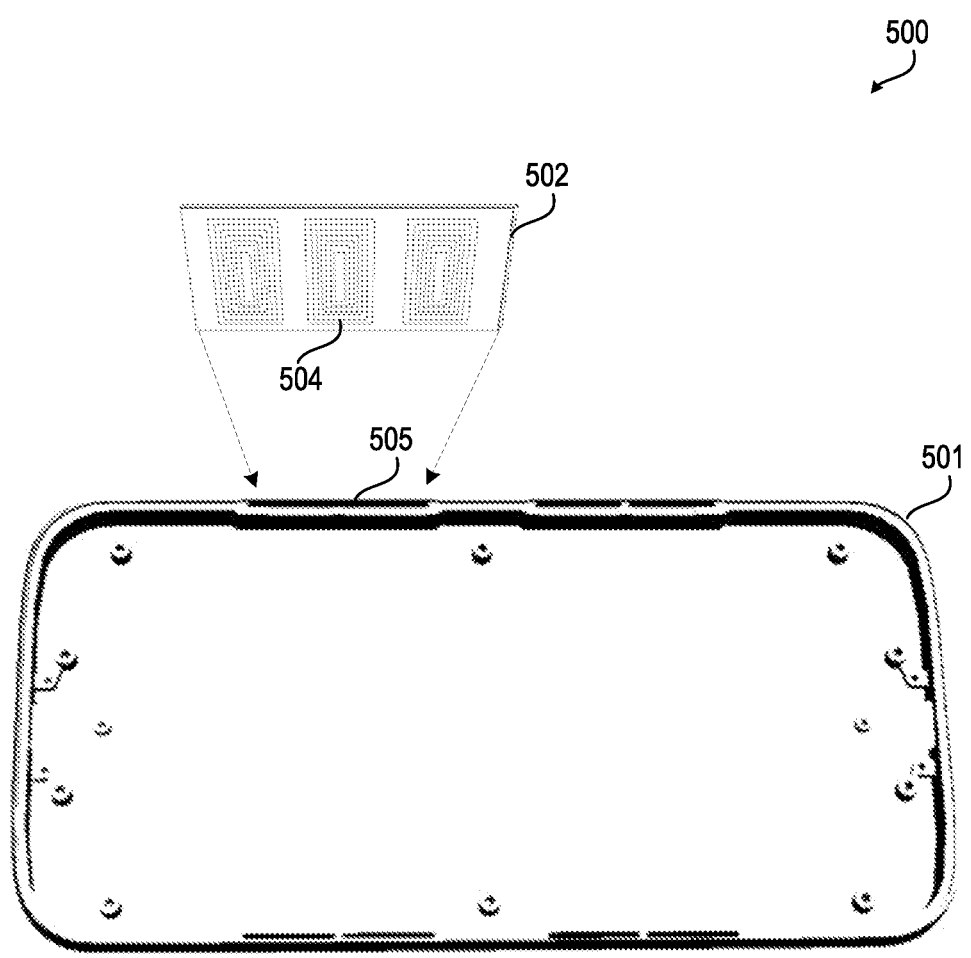
FIG. 5 illustrates an example force-sensitive multiple coil sensor to be utilized in the mobile device of FIG. 1, in accordance with one or more embodiments.

FIG. 5 illustrates an example force-sensitive multiple coil sensor that can be utilized in mobile device 100 of FIG. 1, in accordance with one or more embodiments. FIG. 5 depicts force-sensitive device 500, which includes device casing 501, force-sensitive multiple coil sensor array 502, force-sensitive coil 504, and device casing slot 505.

In one embodiment, force-sensitive multiple coil sensor array 502 is inserted into at least one slotted area, device casing slot 505, of device casing 501. Force-sensitive multiple coil sensor array 502 enables the force sensing circuit (302) to detect changes in the force applied to the electronic device (300). In one example, force-sensitive multiple coil sensor array 502 is a multi-coil inductive device. One or more device casing slots 505 are positioned around the perimeter of device casing 501. One or more force-sensitive multiple coil sensor arrays 502 are positioned within device casing slots 505. Placing force-sensitive multiple coil sensor arrays 502 within each of device casing slots 505 enables the plurality of sensing devices (502) to continuously monitor for tactile motion (203). The plurality of sensing devices (502) monitor for the tactile motion at the exterior of device casing slot 505. Each of a plurality of tactile sensors, such as force-sensitive multiple coil sensor array 502, are affixed to an interior portion of a casing of the electronic device. Force-sensitive multiple coil sensor array 502 can comprise, for example, force sensing piezoelectric sensors. In the example of force-sensitive device 500, four slots are illustrated in device casing 501. In an alternate embodiment, more or less slots are provided in device casing 501. Each of force-sensitive coils 504 can experience a signal change by receiving tactile motion (203) at the exterior surface of device casing 501. The tactile motion (203) is in the form of an instantaneous force and/or a lateral movement by a user of the electronic device (100). Processor IC 105 measures the change in the force associated with the tactile motion (203) detected by at least one of the plurality of tactile sensors. The plurality of sensing devices can thereby detect a location associated with at least one of an input force, a pressure, and/or a strain provided to mobile device 100. The input force, pressure, and/or strain initiates and/or manipulates at least one functional setting of the device operations.

FIGS. 6A-D illustrate example force detection areas for an embedded sensor arrays (310A-D) at a surface of a mobile device, in accordance with one or more embodiments. FIGS. 6A-D provide example force-sensitive sensor array positions for use in the mobile device of FIG. 1. FIG. 6A depicts electronic device 600A which includes camera lens 602 force-sensitive area 604, and keep out area 610. In one embodiment, force-sensitive area 604 is a predetermined length that is above a recommended keep out area (610). Force-sensitive area 604 may include, for example, four discrete sensors that have a detection area that overlap. The overlapping detection area provides smooth interpolation between embedded sensor arrays (310A-D). After the electronic device powers on, processor IC 105 enables force sensitive area 604 to be a full swipe/slide area. Force sensitive area 604 detects instantaneous force and lateral movement provided to that exterior area of electronic device 600A.

FIG. 6B depicts another embodiment of electronic device 600B, which includes camera lens 602, force-sensitive area 604, keep out area 610, select sensor A 613, select sensor B 615, and select sensor C 617. In one embodiment, select sensor A 610, select sensor A 613, and select sensor B 615 provide distinct areas that function as "buttons" or "keys". Providing a tactile motion (e.g., 203 of FIG. 2) at the area of select sensor A 613, select sensor B 615, and/or select sensor C 617 can provide a binary change to a predetermined operational setting of device 600B.

Further, electronic device 600B also includes force-sensitive area 604. In one embodiment, a tactile motion (203) is detected at a first select sensor, select sensor A 613, initiating a change in an operational setting of electronic device 600B. In response to detection of tactile motion (203) at select sensor A 613, select sensor B 615, and select sensor C 617 become temporarily enabled and force-sensitive area 604 is monitored for subsequent tactile motion (203). The subsequent tactile motion (203) can provide a binary and/or linear change to the predetermined operational setting of electronic device 600B.

FIG. 6C provides similar functionality to electronic device 600B, except force-sensitive area 604 extends across a larger area of an electronic device. FIG. 6C depicts electronic device 600C, which includes camera lens 602, force-sensitive area 604, keep out area 610, select sensor A 613, select sensor B 615, and select sensor C 617. In one embodiment, keep out area 610 is repositioned and force-sensitive area 604 can extend past what was previously defined as keep out area 610. The detection area provided by select sensor A 613, select sensor B 615, and select sensor C 617 that detects tactile motion (203) can be customized (increased and or decreased) for a select user. In response to processor IC 105 receiving a request to increase and/or decrease the detection area, processor IC 105 enables and/or disables one or more select sensors. For example, default settings for electronic device 600C are for a user with an "average" size hand that requires two adjacent sensors (e.g., sensor B and C) to provide the detection area. In response to an end user of electronic device 600C having hands that prefer a different ergonomic setting/preference, the user may request that the force-sensitive detection area be a smaller (requiring a single sensor) and/or larger area (requiring all three sensors). In response to the request to reconfigure force-sensitive detection area 604 of electronic device 600C, processor IC 105 enables and/or disables one or more select sensors. As depicted in FIG. 6C, processor IC 105 disables select sensor C 617, which can be in response to the user modifying the configuration of the detection area to account for the user's smaller hands. Therefore, the configuration of the detection area is selected based on a user preference for a smaller detection. In another embodiment, the configuration of the detection area is selected based on a request for a different location of the detection area.

In the embodiment of FIG. 6D, the tactile motion detection area provided by force-sensitive area 604 and select sensor A 613 extends past the suggested keep out area 610. In one embodiment, the diameter of a coil that is positioned above keep out area 610 is increased (during manufacture of the device) to detect tactile motion beyond keep out area 610.

Figure 7:
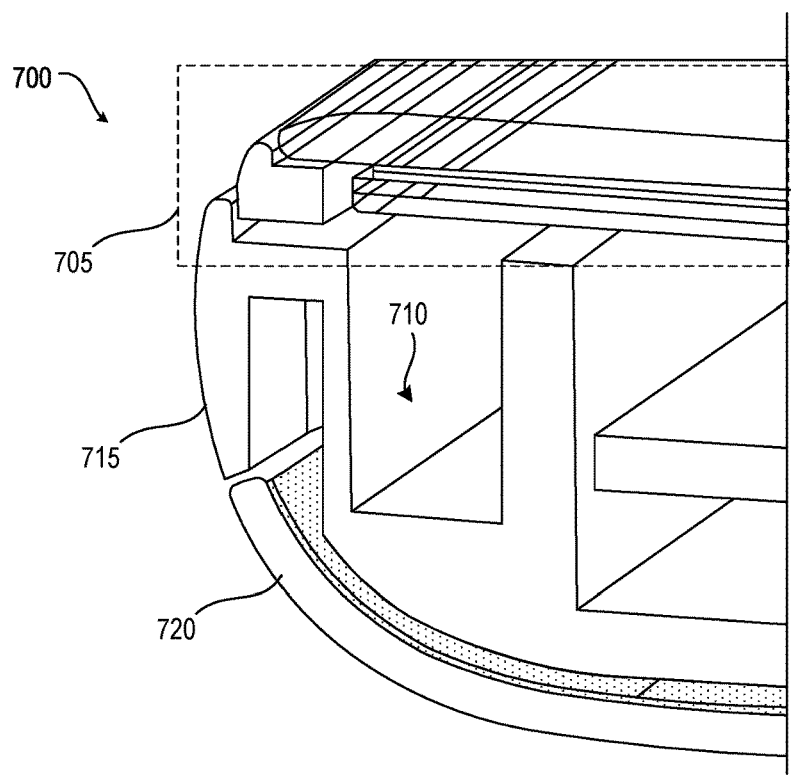
FIG. 7 illustrates a cross-sectional view of an area beneath a display layer for positioning an embedded sensor array to detect force at the surface of a mobile device, in accordance with one or more embodiments.

FIG. 7 illustrates a cross-sectional view of an area, which is beneath a display layer, used for positioning an embedded sensor array to detect force at the surface of a mobile device, in accordance with one or more embodiments. Cross-section view 700 depicts display device 705, casing slot 710, device casing 715, and isolating wall 720. In one embodiment, casing slot 710 is positioned beneath an output device, such as provided by display layers 705. Isolating wall 720 enables sensor coils, such as sensor 410A, to be isolated from other sensor coils. Isolating the sensor coils from each other enable the sensor coil to provide discrete sensing without signal interference between coils. In an alternate embodiment, a thinner or thicker isolating wall relative to the distance between sensors is selectively provided to respectively decrease or increase isolation of the sensor coil signals.

Figure 8:
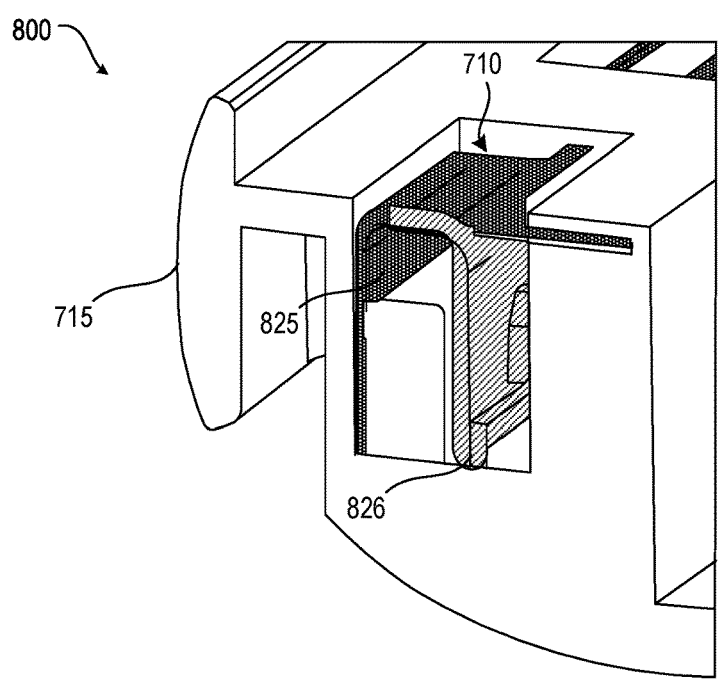
FIG. 8 illustrates a cross-sectional view of an embedded sensor array to detect force at the surface of a mobile device, in accordance with one or more embodiments.

FIG. 8 illustrates a cross-sectional view of an embedded sensor array that detects force at the surface of a mobile device, in accordance with one or more embodiments. Cross-section view 800 illustrates casing slot 710, device casing 715, force sensing circuit 825, and metal stiffener 826. In one embodiment, force sensing circuit 825 is an inductive sensing circuit. Force sensing circuit 825 is positioned within casing slot 710 at an interior space of device casing 715. Force sensing circuit 825 detects a deflection force from the tactile motion received at the exterior of device casing 715. Force sensing circuit 825 can include, for example, metal stiffener 826 to keep circuit elements in a position to detect the tactile motion received at the exterior of device casing 715.

Figure 9:
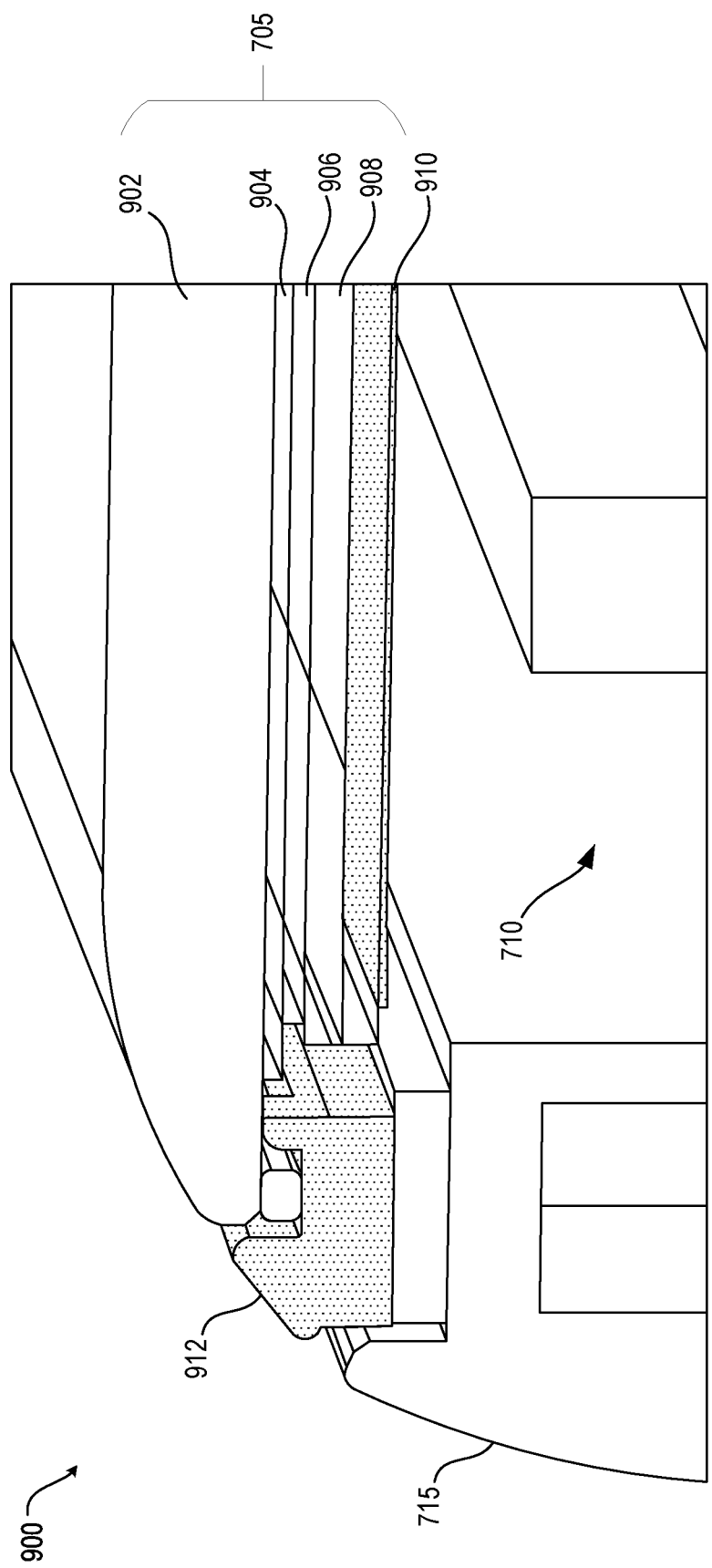
FIG. 9 illustrates a cross-sectional view of a display layer of which an embedded sensor is positioned beneath for force detection at the surface of a mobile device, in accordance with one or more embodiments.

FIG. 9 illustrates a cross-sectional view of a display layer, beneath which an embedded sensor is positioned for force detection at the surface of a mobile device, in accordance with one or more embodiments. Cross-section view 900 depicts casing slot 710, device casing 715, display spacer 912, and display device 705. Display device 705 includes optical lens 902, optical character reader 904, polarizer 906, glass display panels 908, and adhesive layer 910. In one embodiment, force sensing circuit 825 is positioned beneath display device 705. Processor IC 105 detects the first change and each subsequent change of the force via force sensing circuit 825 that is positioned within casing slot 710. Processor IC 205 enables display device 705 to display an interactive interface, such as that of device setting GUI 205 in response to a trigger. In response to detecting the trigger, the interactive interface exhibits, for example, a graphic symbol associated with the at least one setting of the electronic device. The trigger activates at least one of the plurality of sensing devices within force sensing circuit 825 to monitor for changes in the force sensing circuit that correspond to a change in the functional settings of mobile device 100.

Figure 10:
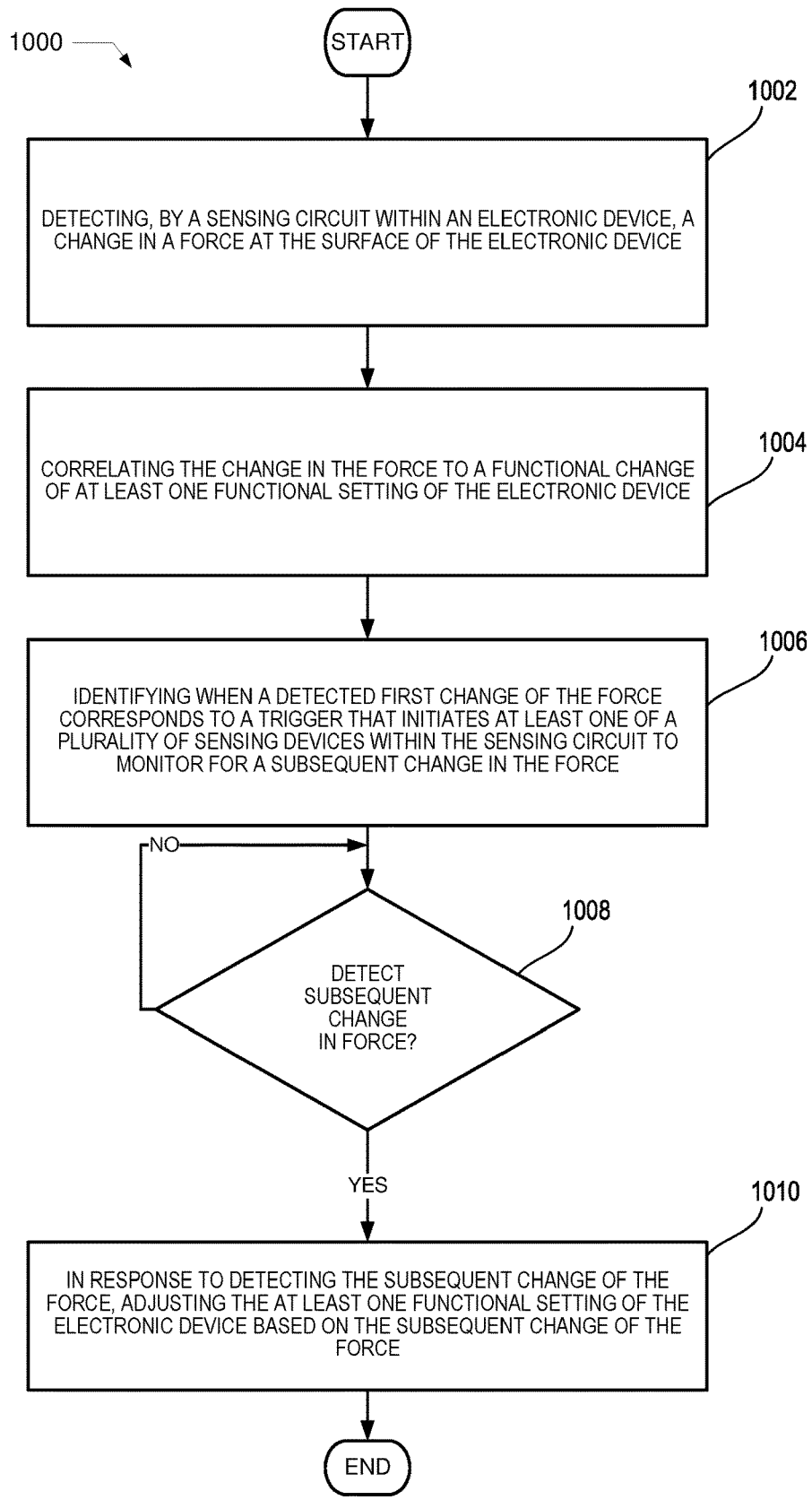
FIG. 10 is a flow chart illustrating a method for detecting force at the surface of a mobile device using a force-sensitive embedded sensing array, in accordance with one or more embodiments.
Figure 11:
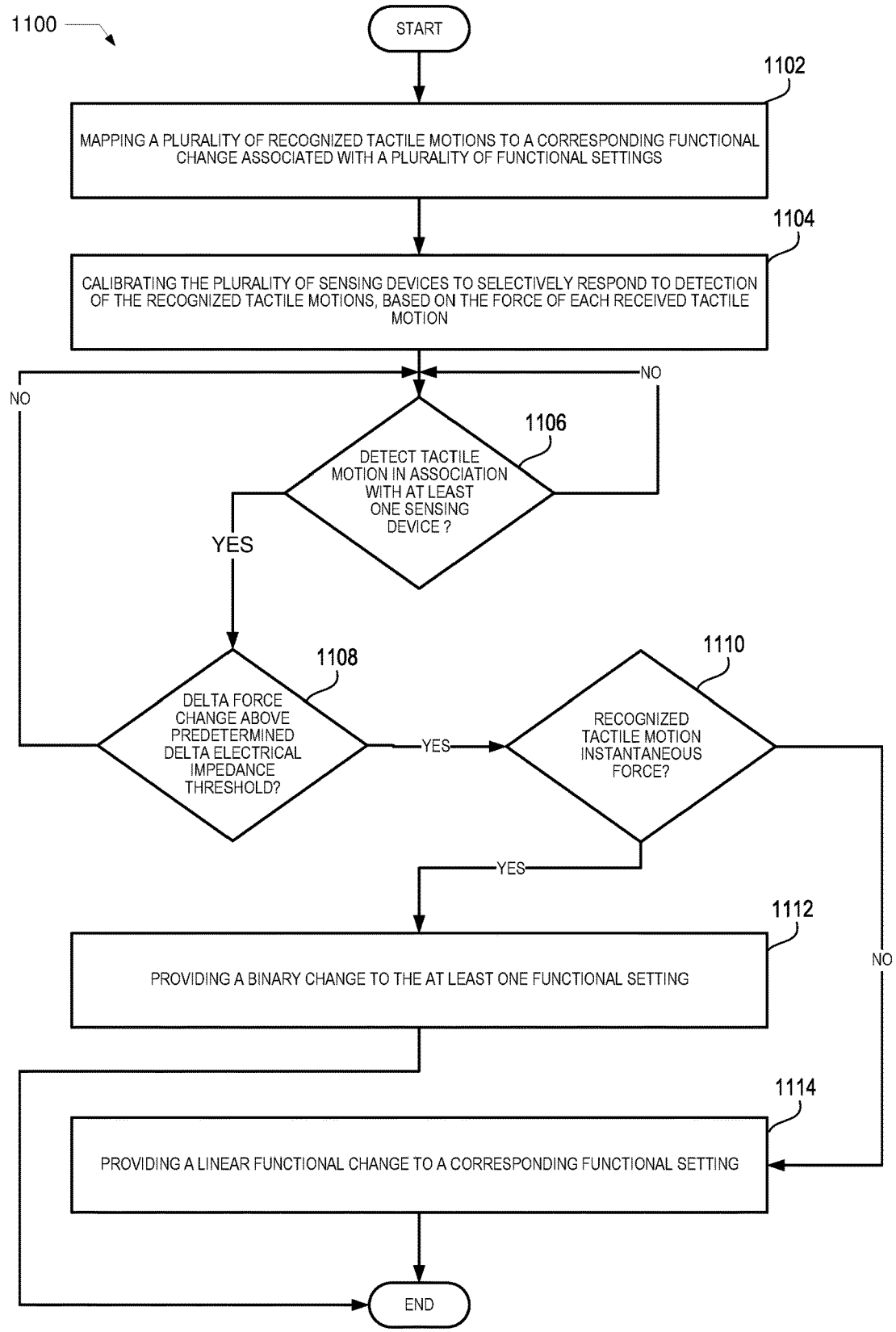
FIG. 11 is a flow chart illustrating a method for calibrating a force-sensitive embedded sensing array to change at least one function setting of a mobile device, in accordance with one or more embodiments.

Referring now to the flow charts of FIGS. 10 and 11. In FIG. 10, there is depicted a method for detecting force at the surface of a mobile device using a force-sensitive embedded sensing array, in accordance with one or more embodiments. In FIG. 11, there is depicted a method for calibrating a force-sensitive embedded sensing array that is utilized to change at least one function setting of a mobile device, in accordance with one or more embodiments. Aspects of each method are described with reference to the components of FIGS. 1-9. Several of the processes of the methods provided in FIGS. 10 and 11 can be implemented by a processor (e.g., processor IC 105) executing software code of HSSU 113.

The method processes described in FIG. 10 generally describe the detection of tactile force at the exterior of mobile device 100. Method 1000 commences at the start block, then proceeds to block 1002. At block 1002, processor IC 105 of electronic device (100) detects, by a force-sensing circuit (302) within electronic device (100), a change in force applied to a surface of the electronic device (100). Processor IC 105 correlates the change in the force applied to the surface to a functional change of at least one setting of the electronic device (100), at block 1004. At block 1006, processor IC 105 identifies when a detected change in force is a first change. The first change in force corresponds to a trigger that activates at least one of a plurality of sensing devices (310A-D) within the force sensing circuit (302) to monitor for a subsequent change in the force. At block 1008 a decision is made whether processor IC 105 detects a subsequent change in force associated with at least one of the plurality of sensing devices within the force sensing circuit (302) of electronic device (100). In response to not detecting a subsequent change in force, processor IC 105 waits at block 1008. In response to detecting a subsequent change in force, at block 1008, processor IC 105 continues to block 1010. At block 1010 in response to detecting the subsequent change of the force, processor IC 105 adjusts the at least one functional setting of the electronic device (100) based on the subsequent change of the force. The process concludes at the end block.

The method processes described in FIG. 11 generally describe initiating a change to a functional setting of mobile device 100. Method 1100 commences at the start block, then proceeds to block 1102. At block 1102 processor IC 105 maps a plurality of recognized tactile motions to a corresponding functional change associated with a plurality of functional settings. Processor IC 105 calibrates the plurality of sensing devices to selectively respond to detection of the recognized tactile motions, based on the force of each received tactile motion, at block 1104. At block 1106, processor IC 105 determines whether a tactile motion (203) in association with at least one sensing device (310A-D) has been detected. In response to no tactile motion being detected, processor IC 105 waits at block 1106. In response to tactile motion being detected, at block 1108, processor IC 105 determines whether the delta in electrical impedance is above a predetermined electrical impedance delta threshold. In response to the electrical impedance delta not being above a predetermined electrical impedance delta threshold, processor IC 105 waits at block 1106. In response to the electrical impedance delta being above the predetermined electrical impedance delta threshold, at block 1110, processor IC 105 determines whether the recognized tactile motion is an instantaneous force. In response to the recognized tactile motion being an instantaneous force, processor IC 105 provides a binary change to at least one functional setting, at block 1112. In response to the recognized tactile motion not being an instantaneous force, at block 1112, processor IC 105 provides a linear change to a corresponding functional setting. The process concludes at the end block.

In the above-described flow charts, one or more of the method processes may be embodied in a computer readable device containing computer readable code such that a series of steps are performed when the computer readable code is executed on a computing device. In some implementations, certain steps of the methods are combined, performed simultaneously or in a different order, or perhaps omitted, without deviating from the scope of the disclosure. Thus, while the method steps are described and illustrated in a particular sequence, use of a specific sequence of steps is not meant to imply any limitations on the disclosure. Changes may be made with regards to the sequence of steps without departing from the spirit or scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, or other programmable data processing apparatus to produce a machine that performs the method for implementing the functions/acts specified in the flowchart and/or block diagram block or blocks. The methods are implemented when the instructions are executed via the processor of the computer or other programmable data processing apparatus.

As will be further appreciated, the processes in embodiments of the present disclosure may be implemented using any combination of software, firmware, or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device can include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

Where utilized herein, the terms "tangible" and "non-transitory" are intended to describe a computer-readable storage medium (or "memory") excluding propagating electromagnetic signals; but are not intended to otherwise limit the type of physical computer-readable storage device that is encompassed by the phrase "computer-readable medium" or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

While the disclosure has been described with reference to example embodiments, it will be understood by those skilled in the art that various changes may be made and equivalents may be substituted for elements thereof without departing from the scope of the disclosure. In addition, many modifications may be made to adapt a particular system, device, or component thereof to the teachings of the disclosure without departing from the scope thereof. Therefore, it is intended that the disclosure not be limited to the particular embodiments disclosed for carrying out this disclosure, but that the disclosure will include all embodiments falling within the scope of the appended claims.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    detecting, by a force sensing circuit within an electronic device, a change in force applied to a surface of the electronic device, the force sensing circuit comprising a microcontroller and digital converters connected via respective integrated circuit busses to a plurality of sensor arrays, each sensor array comprised of a plurality of linearly aligned sensors that detect changes in a change in force at the surface of the electronic device due to one or more of an input force, pressure or strain detected by the sensors, each of the plurality of sensor arrays define a force sensitive area with at least a first sensor and a second sensor, each sensor being a physical sensing device;
    identifying, by the microcontroller, when a detected change in force is a first change above a predetermined force delta threshold, the first change being above the predetermining force delta threshold operating as an activation trigger that activates at least one physical sensing device to monitor for a subsequent change in the force;

in response to detection of a tactile motion at one sensor within a sensor array, temporarily enabling each other sensor within the sensor array to monitor a corresponding force-sensitive area for the subsequent change in force, wherein the each other sensor is then activated to monitor for the subsequent change in force in response to the first change in force detected being above the predetermined force delta threshold;

in response to the detected change in force being above the predetermined force delta threshold, activating at least one other sensing device within the force sensing circuit to monitor for detection of the subsequent change in force that correlates to a functional change of at least one setting of the electronic device, the subsequent change in force being a different change in force from the first change; and in response to detecting the subsequent change in force: correlating the subsequent change in force to the functional change of at least one setting of the electronic device; and adjusting, by a processor, the at least one setting of the electronic device to correlate with the functional change, based on the detected subsequent change of the force.

2. The method of claim 1, wherein:

the at least one sensing device within the force sensing circuit detects changes in the change in force of the electronic device, and the at least one sensing device is affixed to an interior portion of a casing of the electronic device; and the functional change corresponds to received signal information from the plurality of sensors, including signal position, movement, and intensity.

3. The method of claim 2, further comprising determining that the change in force is a recognized tactile motion from among an instantaneous force and a lateral movement at an exterior surface of the casing of the electronic device.

4. The method of claim 3, further comprising:

in response to the recognized tactile motion being an instantaneous input force:

recording a value of the instantaneous input force and determining whether the value of the instantaneous input force is above a predetermined threshold; and in response to the value of the instantaneous input force being above the predetermined threshold, providing a binary change that enables a toggle between power states of the at least one setting; and in response to the recognized tactile motion being a lateral tactile movement that transitions along a segment of the exterior surface of the casing, providing a linear functional change to a corresponding at least one setting.

5. The method of claim 1, further comprising determining when a recognized tactile motion causes a respective delta in the force at the surface that correlates to activating the first change and triggering monitoring for the subsequent change in the force at the surface of the electronic device, wherein the first change and the subsequent change are activated when the respective delta in the force is greater than a respective, predetermined force delta threshold.

6. The method of claim 1, further comprising:

mapping each of a plurality of recognized tactile motions to a corresponding functional change respectively associated with at least one of a plurality of settings; and calibrating the plurality of sensing devices to selectively respond to detection of the recognized tactile motions.

7. The method of claim 1, further comprising:

detecting the first change and the subsequent change of the force by the at least one sensing device that is positioned beneath an output device, wherein the output device includes at least one of a display panel and an optical lens; and displaying, on the output device, an interactive interface that exhibits a graphic symbol associated with the at least one setting of the electronic device in response to detecting the trigger.

8. The method of claim 1, further comprising:

measuring the change in the force associated with a plurality of tactile sensors when one of the at least sensing device is a slotted, multi-coil inductive device that includes a plurality of tactile sensors for continuously detecting a location associated with at least one of an input force, a pressure, and a strain;

in response to detecting an initial position and a directional movement of a tactile motion in association with the plurality of tactile sensors, determining whether the directional movement of the tactile motion is either an instantaneous input force or a lateral movement based on a magnitude and a time derivative of the change in the force; and converting a received one or more of the input force, the pressure, and the strain to an electrical signal to respectively identify which of the plurality of tactile sensors detects the directional movement of the tactile motion.

9. The method of claim 1, wherein the force sensing circuit includes one or more piezoelectric sensors within the sensor arrays, the sensor arrays being spaced to receive instantaneous forces as well as detect a lateral movement of a force at an exterior surface of a casing of the electronic device.

10. An electronic device comprising:

a processor;

a sensing circuit coupled to the processor, the sensing circuit comprising a microcontroller, digital converters connected via respective integrated circuit busses to a plurality of sensor arrays, each sensor array comprised of a plurality of linearly aligned sensors that detect changes in a change in force at the surface of the electronic device due to one or more of an input force, pressure or strain detected by the sensors, each of the plurality of sensor arrays define a force sensitive area with at least a first sensor and a second sensor, each sensor being a physical sensing device, wherein the sensing circuit:

detects, via at least one sensor within the plurality of sensor arrays, the change in the force at the surface of the electronic device;

identifies, via the microcontroller, when a detected change in the force corresponds to a first change above a predetermined force delta threshold, the first change being above the predetermining force delta threshold operating as an activation trigger that activates at least one physical sensing device to monitor for a subsequent change in the force;

in response to detection of a tactile motion at one sensor within a sensor array, temporarily enables each other sensor within the sensor array to monitor a corresponding force-sensitive area for the subsequent change in force, wherein the each other sensor is then activated to monitor for the subsequent change in force in response to the first change in force detected being above the predetermined force delta threshold;

in response to the detected change in force being above the predetermined force delta threshold, activates at least one other sensing device within the sensing circuit to monitor for detection of the subsequent change in force that correlates to a functional change of at least one setting of the electronic device; and in response to detecting the subsequent change in force, transmit, by the microcontroller, a delta value associated with the subsequent change in the force to the processor, the subsequent change in force being a different change in force from the first change; and a memory system communicatively coupled to the processor and having stored thereon a surface sensing utility that executes on the processor to enable the processor to:

in response to receiving notification of the subsequent change from the sensing circuit:

correlate the delta value associated with the subsequent change in the force to the at least one setting of the electronic device; and adjust the at least one setting of the electronic device based on the detected subsequent change of the force.

11. The electronic device of claim 10, wherein:

the at least one sensing device is affixed to an interior portion of a casing of the electronic device, and the surface sensing utility further enables the processor to detect, by the at least one sensing device, the change in the force at the surface of the electronic device;

the functional change corresponds to received signal information from the plurality of sensors, including signal position, movement, and intensity.

12. The electronic device of claim 11, wherein the surface sensing utility further enables the processor to:

determine that the change in force is a recognized tactile motion that is one of an instantaneous force and a lateral movement at an exterior surface of the casing of the electronic device;

in response to the recognized tactile motion being an instantaneous input force at the exterior surface of the casing of the electronic device:

recording a value of the instantaneous input force and determining whether the value of the instantaneous input force is above a predetermined threshold; and in response to the value of the instantaneous input force being above the predetermined threshold, providing a binary change that enables a toggle between power states of the at least one setting; and in response to the recognized tactile motion being a lateral tactile movement that transitions along a segment of the exterior surface of the casing of the electronic device, providing a linear functional change to a corresponding at least one setting.

13. The electronic device of claim 10, wherein the hidden surface sensing utility further enables the processor to:

determine when the recognized tactile motion causes the respective delta value associated with changes in the force at the surface of the electronic device that correlate to activating the detected first change and triggering a monitoring for the subsequent change in the force at the surface of the electronic device, wherein the detected first change and the subsequent change are activated when the respective delta value in the force is greater than a respective, predetermined force delta threshold;

map each of a plurality of recognized tactile motions to a corresponding functional change respectively associated with at least one of a plurality of settings; and calibrate the plurality of sensing devices to selectively respond to detection of the recognized tactile motions, based on an input force of a received tactile motion.

14. The electronic device of claim 10, further comprising:

a display device that includes at least one of a display panel and an optical lens; and wherein the surface sensing utility further enables the processor to:

detect the detected first change and the subsequent change of the force by the at least one sensing device that is positioned beneath the display device; and output, on the display device, an interactive interface that exhibits a graphic symbol associated with the at least one setting of the electronic device in response to detecting the trigger.

15. The electronic device of claim 10, wherein one of the at least one sensing device is a slotted, multi-coil inductive device that includes a plurality of tactile sensors for continuously detecting a location associated with an input force, a pressure, and a strain, and wherein the hidden surface sensing utility further enables the processor to:

record the change in the force;

in response to detection of an initial position and a directional movement of a tactile motion at the plurality of tactile sensors, determine, based on a magnitude and a time derivative of the change in the change in force, whether the directional movement of the tactile motion is either an instantaneous force or a lateral movement force; and convert a received one or more of the input force, the pressure, and the strain to an electrical signal to respectively identify which of the plurality of tactile sensors detects the directional movement of the tactile motion.

16. A computer program product comprising:

a computer readable storage device; and program code on the computer readable storage device that when executed within a processor associated with an electronic device, the program code enables the electronic device to provide a functionality of:

detecting, by a force sensing circuit within the electronic device, a change in a force applied at a surface of the electronic device, the force sensing circuit comprising a microcontroller, digital converters connected via respective integrated circuit busses to a plurality of sensor arrays, each sensor array comprised of a plurality of linearly aligned sensors that detect changes in a change in force at the surface of the electronic device due to one or more of an input force, pressure or strain detected by the sensors, each of the plurality of sensor arrays define a force sensitive area with at least a first sensor and a second sensor, each sensor being a physical sensing device;

correlating the change in the force to at least one setting of the electronic device;

identifying, by the microcontroller, when a detected change in force is a first change above a predetermined force delta threshold, the first change being above the predetermining force delta threshold operating as an activation trigger that activates at least one physical sensing device to monitor for a subsequent change in the force;

in response to detection of a tactile motion at one sensor within a sensor array, temporarily enabling each other sensor within the sensor array to monitor a corresponding force-sensitive area for the subsequent change in force, wherein the each other sensor is then activated to monitor for the subsequent change in force in response to the first change in force detected being above the predetermined force delta threshold;

in response to the detected change in force being above the predetermined force delta threshold, which detected change operates as an activation trigger, activating at least one other sensing device within the force sensing circuit to monitor for detection of the subsequent change in force that correlates to a functional change of at least one setting of the electronic device, the subsequent change in force being a different change in force from the first change; and in response to detecting the subsequent change in force: correlating the subsequent change in force to the functional change of the at least one setting of the electronic device; and adjusting, by the processor, the at least one setting of the electronic device to correlate with the functional change, based on the detected subsequent change in force.

17. The computer program product of claim 16, wherein the program code further comprises program code that enables the electronic device to provide a functionality of:

detecting the change in the force of the electronic device at the at least one sensing device within the sensing circuit, which detects changes in the force of the electronic device, and wherein the at least one sensing device is affixed to an interior portion of a casing of the electronic device;

determining when a recognized tactile motion is one of an instantaneous force and a lateral movement at an exterior surface of the casing of the electronic device;

in response to the recognized tactile motion being an instantaneous input force:
  recording a value of the instantaneous input force and determining whether the value of the instantaneous input force is above a predetermined threshold; and
  in response to the value of the instantaneous input force being above the predetermined threshold, providing a binary change that enables a toggle between power states of the at least one setting; and in response to the recognized tactile motion being a lateral tactile movement that transitions along a segment of the exterior surface of the casing, providing a linear functional change to a corresponding at least one setting.

18. The computer program product of claim 16, wherein the program code further comprises program code that enables the electronic device to provide a functionality of:

determining when the recognized tactile motion causes a respective delta in the force that correlates to activating the first change and the subsequent change in the force of the electronic device, wherein the first change and the subsequent change are activated when the respective delta in the force is greater than a respective, predetermined force delta threshold;

mapping each of a plurality of recognized tactile motions to a corresponding functional change respectively associated with at least one of a plurality of settings; and calibrating the plurality of sensing devices to selectively respond to detection of the recognized tactile motions.

19. The computer program product of claim 16, wherein the program code further comprises program code that enables the electronic device to provide a functionality of:

detecting the first change and the subsequent change of the force by the at least one sensing device that is positioned beneath an output device, wherein the output device includes at least one of a display panel and an optical lens; and displaying, on the output device, an interactive interface that exhibits a graphic symbol associated with the at least one setting of the electronic device in response to detecting the trigger.

20. The computer program product of claim 16, wherein the program code further comprises program code that enables the electronic device to provide a functionality of:

measuring the change in the force associated with a plurality of tactile sensors when at least one of the plurality of sensing devices is a slotted, multi-coil inductive device that includes a plurality of tactile sensors for continuously detecting a location associated with at least one of an input force, a pressure, and a strain;

in response to detecting an initial position and a directional movement of a tactile motion in association with the plurality of tactile sensors, determining whether the directional movement of the tactile motion is either an instantaneous input force or a lateral movement based on a magnitude and a time derivative of the change in the force; and converting a received one or more of the input force, the pressure, and the strain to an electrical signal to respectively identify which of the plurality of tactile sensors detects the directional movement of the tactile motion.

* * * * *